US006865113B2

(12) United States Patent
Voicu et al.

(10) Patent No.: US 6,865,113 B2
(45) Date of Patent: Mar. 8, 2005

(54) SYSTEM AND METHOD FOR PROGRAMMING NON-VOLATILE MEMORY

(75) Inventors: Gelu Voicu, San Jose, CA (US); Carmen M. Stangu, Santa Clara, CA (US); Adam Peter Cosmin, San Jose, CA (US)

(73) Assignee: Catalyst Semiconductor, Inc., Sunnyvale, CA (US)

( * ) Notice: Subject to any disclaimer, the term of this patent is extended or adjusted under 35 U.S.C. 154(b) by 28 days.

(21) Appl. No.: 10/626,256

(22) Filed: Jul. 23, 2003

(65) Prior Publication Data

US 2005/0018487 A1 Jan. 27, 2005

(51) Int. Cl.$^7$ .............................................. G11C 16/00
(52) U.S. Cl. ........................... 365/185.28; 365/185.05; 365/226
(58) Field of Search ....................... 365/185.28, 185.05, 365/185.23, 226

(56) References Cited

U.S. PATENT DOCUMENTS 5,444,664 A * 8/1995 Kuroda et al. .............. 365/226
6,449,197 B1 * 9/2002 Hiraki et al. ............ 365/189.05
6,584,013 B2 * 6/2003 Senda et al. ............. 365/185.08

* cited by examiner

Primary Examiner—Tan T. Nguyen
(74) Attorney, Agent, or Firm—Bever, Hoffman & Harms, LLP; E. Eric Hoffman

(57) ABSTRACT

Circuitry for programming a non-volatile memory of an integrated circuit is disclosed. The circuitry requires only three pins: a power pin, a ground pin, and a data pin. Programming mode is initiated by coincidentally applying high voltages at the power pin and the data pin. The memory cells may be programmed individually in sequence, or all at once. A clock signal for selecting the memory cells is obtained through serial high voltage pulses applied to the power pin. The clock signal increments a state machine, which in turn causes one or more of the memory cells to be selected. Binary data is provided to the data pin, is stored, and is then provided to the memory cells. A high voltage pulse subsequently received at the data pin is passed to the memory cells, and causes the stored data to be programmed into the selected memory cell(s).

31 Claims, 3 Drawing Sheets

SYSTEM AND METHOD FOR PROGRAMMING NON-VOLATILE MEMORY

BACKGROUND OF THE INVENTION

1. Technical Field

The present invention relates to non-volatile memory integrated circuits, and in particular to a method and structure for programming a non-volatile memory integrated circuit.

2. Description of the Related Art

Some integrated circuits include a non-volatile memory composed of a plurality of non-volatile memory cells. Non-volatile memory retains data even after power to the memory is turned off. One common type of non-volatile memory is an EEPROM (Electrically Erasable Programmable Read-Only Memory).

In some applications, data may be written to, that is, programmed in, a non-volatile memory of an integrated circuit through externally-accessible pins of the integrated circuit. Typically, more than three pins are required to program a non-volatile memory. However, each such pin increases the size and cost of the integrated circuit. Accordingly, a need exists for a means by which a non-volatile memory can be programmed using as few pins as possible.

SUMMARY

The present invention includes circuits and methods for programming a non-volatile memory (e.g., an EEPROM) within an integrated circuit, using only three pins of the integrated circuit: (1) a power pin; (2) a data pin; and (3) a ground pin.

In one embodiment, an integrated circuit is provided that includes a non-volatile memory, and a programming circuit coupled to the non-volatile memory. The programming circuit comprises a power pin, a data pin, and a ground pin. A fixed-level nominal voltage is continuously applied to the power pin to power the integrated circuit. A programming mode is then initiated by applying a high voltage pulse to the power pin, and a high voltage pulse to the data pin while the aforementioned high voltage pulse is present on the power pin. After the programming mode is initiated, a series of high voltage pulses are provided on the power pin. The high voltage pulses are used to select sequential ones of the memory cells for programming. Binary data received at the data pin is temporarily stored in a latch or the like, and then is provided to the memory cells. A high voltage pulse subsequently received at the data pin is then provided to the non-volatile memory cells, and programs the stored binary data into the selected non-volatile memory cell, without programming the non-selected memory cells. The process repeats until all of the memory cells have been individually and sequentially selected and programmed. The programming mode may be exited by powering down the circuit.

In one embodiment, a method for programming the non-volatile memory cells includes simultaneously selecting all of the memory cells in response to a high voltage pulse received at the power pin, and then simultaneously programming all of the memory cells with binary data simultaneously provided to the memory cells.

These and other aspects of the present invention will become apparent in view of the detailed description, and the accompanying drawings, of the exemplary embodiments.

BRIEF DESCRIPTION OF THE DRAWINGS

In the figures, like numbers are used to designate like elements.

DETAILED DESCRIPTION

Figure 1:
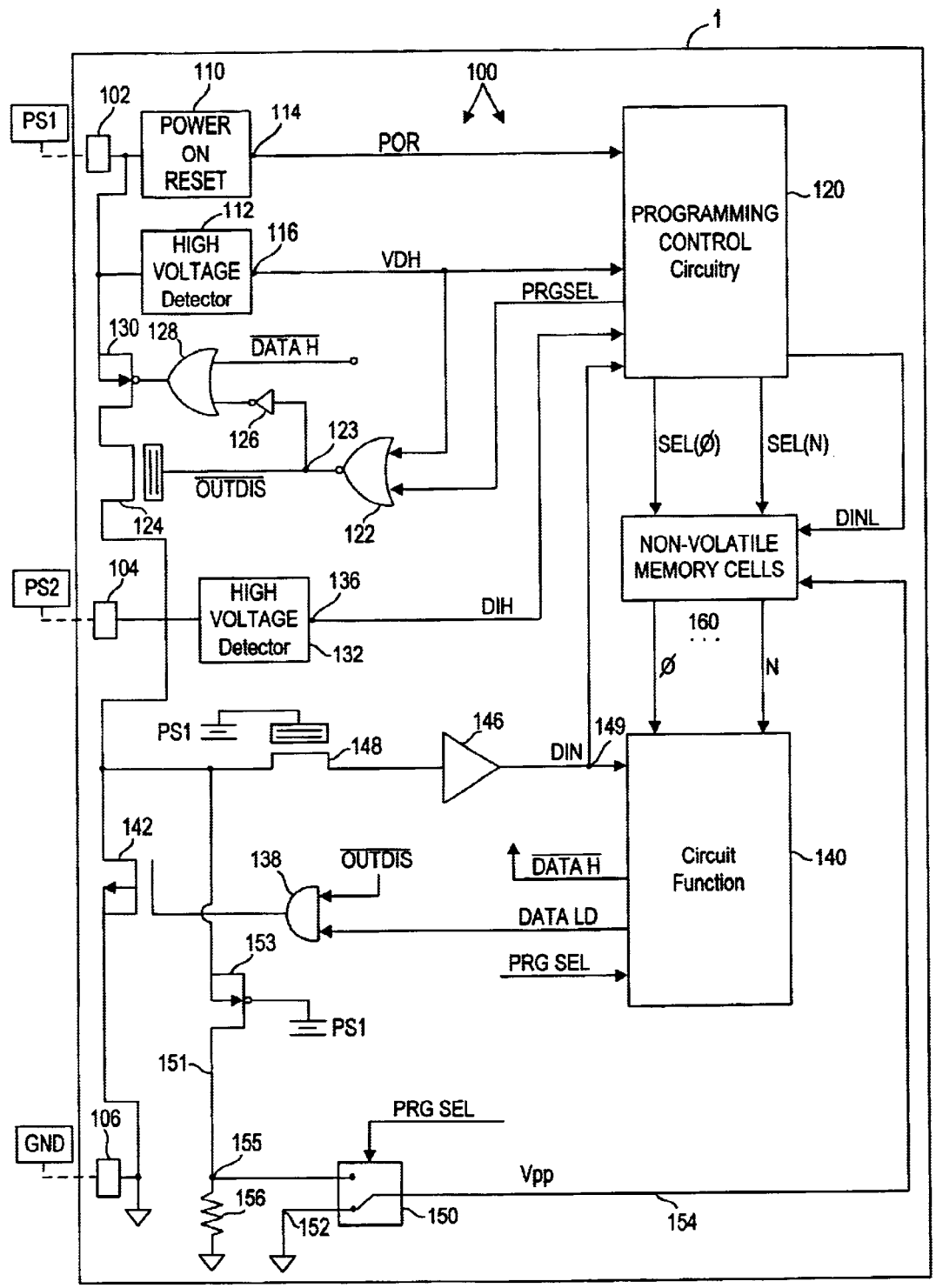
FIG. 1 is a circuit diagram illustrating a circuit for programming a non-volatile memory in accordance with an embodiment of the present invention.

FIG. 1 illustrates portions of an integrated circuit 1, which includes: a plurality of non-volatile memory cells 160 (e.g., an EEPROM); a circuit 100 for programming the non-volatile memory cells 160; and a circuit function block 140. The circuit 100 includes at least three externally-accessible pins of integrated circuit 1: a power pin 102; a data pin 104; and a ground pin 106. Circuit function block 140 uses the data programmed into memory cells 160. In one embodiment, circuit function block 140 allows integrated circuit 1 to function as a reset controller, as discussed below. However, the particular circuitry and function of circuit function block 140 may vary.

In one embodiment, integrated circuit 1 operates in two mutually-exclusive modes: (1) a programming mode, where memory cells 160 are programmed; and (2) a user mode, where circuit function block 140 operates.

The power pin 102 is coupled to an input of a power on reset device 110 and to an input of a high voltage detector 112. As used herein, the terms "connected," "coupled," or variants thereof, mean any electrical connection or electrical coupling, either direct or indirect, between electrical elements.

Figure 3:
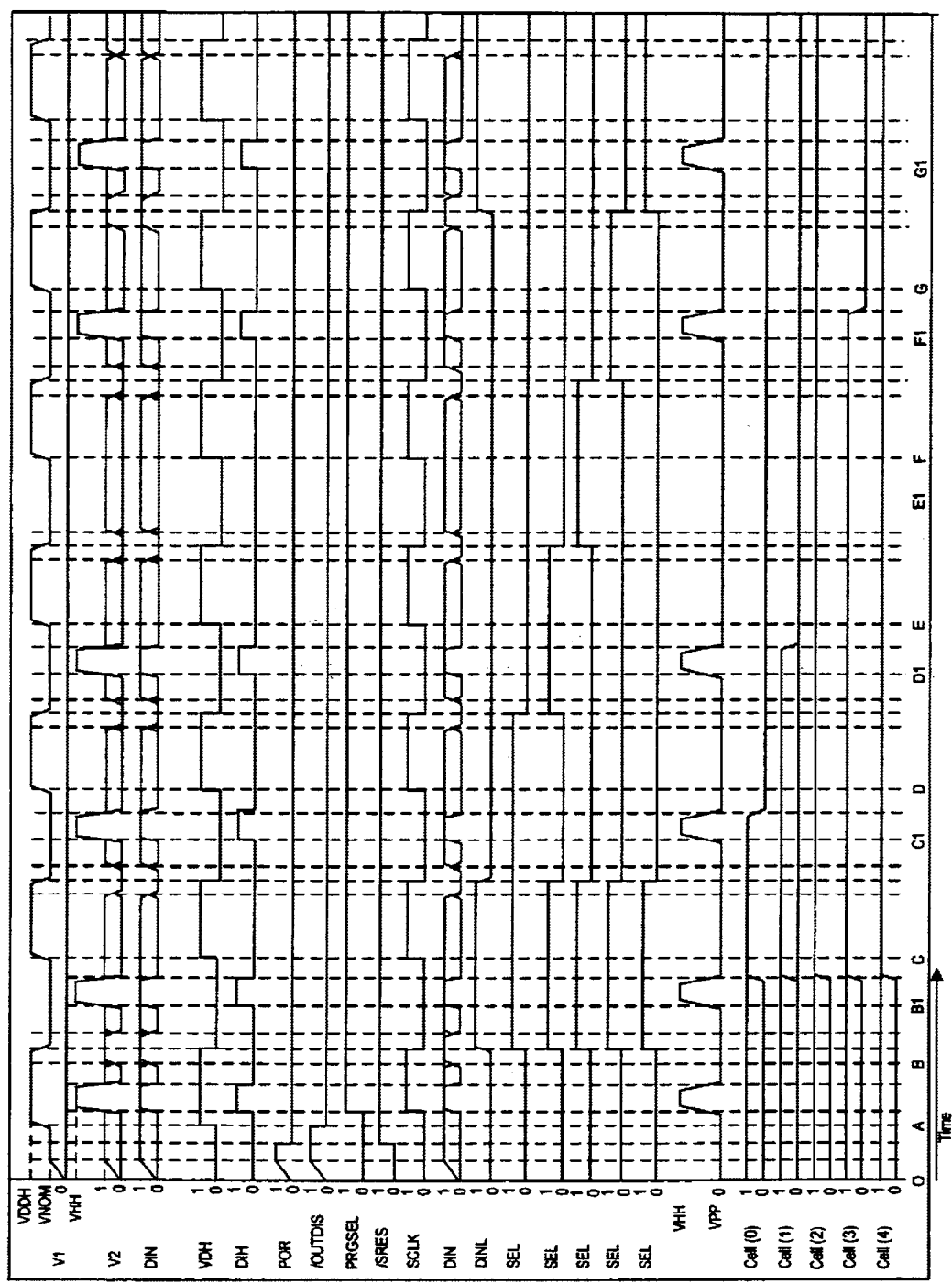
FIG. 3 is a timing diagram for a programming sequence in accordance with an embodiment of the present invention.

During programming, power pin 102 is coupled to a first external power supply PS1 that is capable of supplying a voltage signal V1 having at least two voltage levels to power pin 102. A first, lower voltage level of voltage signal V1, called the nominal voltage or "$V_{NOM}$" herein, is the baseline voltage that powers circuit 100, and is always provided to power pin 102 from power supply V1 when circuit 100 is operating. A second, higher voltage level of voltage signal V1, called "$V_{DDH}$" herein, is provided to power pin 102 from power supply PS1 in the form of periodic, serial pulses. The high voltage $V_{DDH}$ pulses are used to create a clocking signal and to latch data within circuit 100, as is discussed below. In FIG. 3, an example of voltage signal V1 is shown on the top line of the timing chart.

During programming, data pin 104 is coupled to a second external power supply PS2 that provides a voltage signal V2 having a plurality of voltage levels to data pin 104. Voltage signal V2 includes low voltage levels corresponding to binary data, either logical zero or logical one, and high voltage pulses. The high voltage pulses are at a voltage level, called "$V_{HH}$" herein, that is greater than the binary data voltage level and is sufficient to program the memory cells 160. The high voltage $V_{HH}$ pulses received through the data pin 104 are ultimately used within circuit 100 to program binary data previously received through the data pin 104 into one or more selected non-volatile memory cells 160. In the present embodiment, the high voltage $V_{HH}$ pulses received at the data pin 104 via voltage signal V2 are at a voltage level that is greater than the high voltage $V_{DDH}$ pulses received at power pin 102 via voltage signal V1. For example, $V_{NOM}$ may be 5 V, $V_{DDH}$ may be 7.5–8 V, and $V_{HH}$ may be 15–18 V. The specific values will vary with the application. In FIG. 3, an example of voltage signal V2 is shown on the second line from the top of the timing chart.

Ground pin 106 is coupled to a ground voltage source (0 V) during programming.

An external programming device (not shown) that is coupled to power supplies PS1 and PS2 and to circuit 100 of integrated circuit 1 is used to program the non-volatile memory cells 160. Such a programming device typically includes an electrical socket into which the integrated circuit 1 may be inserted, and a controller, such as a processor or personal computer running appropriate software. The controller controls: (1) the provision of voltage signal V1, including the nominal voltage $V_{NOM}$ and the serial high voltage $V_{DDH}$ pulses, from power supply PS1 to power pin 102; (2) the provision of voltage signal V2, including the binary data and high voltage $V_{HH}$ pulses, to the data pin 104; and (3) the provision of the ground voltage (0 V) to the ground pin 106. The programming device may be part of a larger external device that tests other aspects of the operation of the integrated circuit 1.

The power on reset device 110 generates a power on reset signal POR at node 114 in response to detecting power being applied at the power pin 102. In particular, the power on reset device 110 provides the power on reset signal POR at the node 114 upon detecting an initial voltage from the power supply PS1 at the power pin 102. The power on reset signal POR is provided until the voltage at the power pin 102 reaches a predetermined level and a specified time expires, after which the power on reset signal POR is removed from the node 114. As discussed in more detail below, the programming control circuitry 120 receives the power on reset signal POR from the power on reset device 110 and uses the power on reset signal POR to reset internal components.

An input of the high voltage detector 112 is also connected to the power pin 102. The high voltage detector 112 outputs a power pin high voltage signal VDH at node 116 upon detecting a high voltage (i.e., something greater than $V_{NOM}$) at the power pin 102 via voltage signal V1. In one embodiment, the high voltage detector 112 outputs a power pin high voltage signal VDH having logic "high" or "1" when the voltage at the power pin 102 is above a predetermined voltage level. The high voltage detector 112 outputs a power pin high voltage signal VDH signal having logic "low" or "0" when the voltage at the power pin 102 is below the predetermined voltage level. For instance, if $V_{DDH}$ is 7.5–8 V, and $V_{NOM}$ is 5 V, then the high voltage detector 112 may be formed so that it outputs a logic level one whenever at least an intermediate threshold voltage (e.g., 6.5 V) between $V_{NOM}$ and $V_{DDH}$ is detected at power pin 102.

As shown in FIG. 1, the programming control circuitry 120 and NOR gate 122 receive the power pin high voltage signal VDH at respective inputs thereof.

The NOR gate 122 receives the power pin high voltage signal VDH at an input connected to node 116 and receives a program select signal PRGSEL at another input. The program select signal PRGSEL is generated within the programming control circuitry 120, and indicates whether programming mode has been initiated, as discussed below. Based on the power pin high voltage signal VDH and the program select signal PRGSEL, the NOR gate 122 outputs an output disable signal OUTDIS bar at node 123. (The term "bar" is used where the signal is active low.) Thus, the output disable signal OUTDIS bar is logic low when either or both of the power pin high voltage signal VDH and the program select signal PRGSEL signal are logic high.

A gate of a depletion transistor 124 is connected to the node 123 and is controlled by the output disable signal OUTDIS bar. The depletion transistor 124, in one embodiment, comprises a negative-threshold NMOS transistor. Thus, when the output disable signal OUTDIS bar is at logic low, and the source voltage of depletion transistor 124 is at a value higher than the absolute value of the depletion transistor threshold voltage, then the depletion transistor 124 is off (i.e., highly resistive). Thus, the depletion transistor 124 functions as a high voltage isolation device.

An input of an inverter 126 is also connected to the node 123 and receives the output disable signal OUTDIS bar and outputs the inverse thereof to an input of OR gate 128. The OR gate 128 also receives data high signal DATAH bar at another input thereof. The data high signal DATAH bar is generated in the circuit function block 140, as discussed below.

A gate of PMOS transistor 130 is connected to and controlled by the output of the OR gate 128. Thus, when the output of the OR gate 128 is logic high, the PMOS transistor 130 is off (i.e., highly resistive). The output of the OR gate 128 is logic high when either the power pin high voltage signal VDH is high or the data high signal DATAH bar is high. Accordingly, when the power pin high voltage signal VDH is high, the transistors 124, 130 are turned off.

An input of AND gate 138 is also connected (not shown) to the node 123 and receives the output disable signal OUTDIS bar. Another input of the AND gate 138 is connected to and receives a data low signal DATALO from the circuit function block 140, as discussed below. The output of the AND gate 138 is connected to and controls a gate of NMOS transistor 142. Thus, when either the output disable signal OUTDIS bar or the data low signal DATALO is logic low, or "0", the NMOS transistor 142 is off (i.e., highly resistive). Accordingly, when the high voltage detector 112 output goes to logic high, the transistors 130, 124, and 142 are off, thereby creating a high impedance condition at the data pin 104.

An input of high voltage detector 132 is connected to the data pin 104 such that the high voltage detector 132 outputs a data pin high voltage signal DIH at node 136 upon detecting a high voltage at the data pin 104 via voltage signal V2, similar to high voltage detector 112 discussed above. The high voltage detector 132 outputs a DIH signal having logic "high" or "1" when the voltage at the data pin 104 is above a predetermined voltage level and outputs a signal having logic "low" or "0" when the voltage at the data pin 104 is below the predetermined voltage level. In particular, the high voltage detector 132 detects when a high voltage pulse used to initiate the programming mode or to program the non-volatile memory cells is provided at data pin 104 via voltage signal V2. As discussed below, the data pin high voltage signal DIH is used by the programming control circuitry 120.

A data input buffer 146 has an input connected to the data pin 104 via an optional negative-threshold NMOS transistor 148. A gate of the NMOS transistor 148 is connected to power supply PS1, which permits NMOS transistor 148 to prevent voltages higher than the sum of the voltage signal V1 and the absolute value of the transistor 148 threshold voltage from passing through transistor 148 to the data input buffer 146.

The data input buffer 146 outputs a data in signal DIN at node 149 in response to a logic level voltage at the data pin 104. In one embodiment, the data input buffer 146 is configured as a Schmidt trigger, although other input buffers may be alternatively employed. The data in signal DIN is received by the programming control circuitry 120 and the circuit function block 140, as described below.

A switch 150 is connected between a ground terminal 152, line 151 from the data pin 104, and programming voltage ($V_{PP}$) line 154. Switch 150 is controlled by the program select signal PRGSEL generated in the programming control circuitry 120. In one embodiment, the switch 150 may be implemented as a high voltage level shifter. In response to the program select signal PRGSEL signal, the switch 150 electrically connects the high voltage line 154 to the data pin 104 via line 151 so that the high voltage $V_{HH}$ pulse received at the data pin 104 via voltage signal V2 may be provided to the programming voltage input P of the non-volatile memory cells 160 (FIG. 2) via line 154, as the programming voltage $V_{PP}$ (i.e., $V_{PP}=V_{HH}$). The programming voltage signal $V_{PP}$ pulse carried to the memory cells 160 on line 154 is used to program the binary data provided by data line signal DINL into one or more selected non-volatile memory cells 160.

A PMOS transistor 153 is optionally provided in line 151 between data pad 104 and switch 150. The gate of transistor 153 is coupled to power supply PS1. Transistor 153 is a high voltage device that passes high voltages, but impedes voltages below the sum of the voltage signal V1 voltage and the absolute value of the transistor 153 threshold voltage from reaching high voltage switch 150 and the circuitry downstream of switch 150.

The circuit function block 140 of FIG. 1 represents portions of the integrated circuit 1 associated with the user's function for integrated circuit 1 when circuit 100 is not in the programming mode. The structure and purpose of circuit function block 140 can vary.

For example, circuit function block 140 may include circuitry that allows integrated circuit 1 to function as a reset controller, among other possible functions. Reset controllers may be used to monitor a power supply voltage provided to an associated system microcontroller, ASIC, and/or some other integrated circuit or device. If the power supply voltage is out of tolerance, e.g., too low, a reset signal output by the reset controller integrated circuit becomes active, and may be used to prevent the associated system microcontroller, ASIC, or other devices from operating. Reset signals typically become inactive 200 ms or so after the power supply voltage exceeds the reset threshold level.

In user mode, circuit function block 140 receives the data stored in the memory cells 160 through their respective outputs Q (FIG. 2) at all times, or during read operations initiated by circuit function block 140, and may use the data for purposes associated with the user's application. Conventional circuitry associated with memory read operations may be used.

Circuit function block 140 also optionally receives the program select signal PRGSEL from program control circuitry 120. The program select signal PRGSEL may be used to disable elements of circuit function block 140 (e.g., an oscillator or a state machine) that may interfere with programming mode.

Circuit function block 140 outputs the data low signal DATALO and data high signal DATAH bar (which are not necessarily complimentary). The respective value of these signals may be a combination of a memory cell 160 output and some operation of circuit function block 140.

For instance, in a case where circuit function block 140 includes a reset controller function, the value of the data low signal DATALO and the data high signal DATAH bar in the user mode will determine whether transistors 130 and 142, respectively, are on or off, which in turn will determine the output at data pin 104, and hence the external characteristics of the reset controller. Outputs at any other data pins (not shown) also may be controlled by such signals. The particular values programmed into the memory cells 160, therefore, may be used to vary the external characteristics of the reset controller of integrated circuit 1, allowing the maker of integrated circuit 1 to use a single integrated circuit as the basis of a plurality of reset controller products having different external characteristics. For instance, one may configure the reset controller output in user mode as either a push pull (active high or active low) output or as an "open drain-like" output (p-type or n-type). In such a configuration, two memory cells 160 would be required to cover the four possible output configurations. Other memory cells 160 could be used to store values associated with other parameters of the reset controller function, such as a reference voltage parameter, a reset threshold parameter, and timing parameters, among other possibilities.

Depending on the application, circuit function block 140 may use data pin 104 as an input, and may use the data in signal DIN via buffer 146 for the user application performed by circuit function block 140. For instance, in a reset controller application with a push pull configuration, NMOS transistor 142 and PMOS transistor 130 during user mode are on or off in a complimentary fashion. In such a case, the data in signal DIN would not be a useful input to circuit function block 140. On the other hand, for an "open drain-like" configuration, which allows for only one of transistors 142 and 130 to be on or off, and for the other of transistors 142 and 130 to be off all of the time, data pin 104 may be used for providing a data input to circuit function block 140 in user mode. Such a configuration would include external pull up or pull down resistors.

A high value resistor 156 is coupled between node 155 on line 151 and ground. Node 155 is between transistor 153 and switch 150. Resistor 156 provides a leakage path in programming mode when transistor 153 is off.

Power is provided to circuit function block 140 from power supply PS1 through power pin 102 during both programming mode and user mode.

Figure 2:
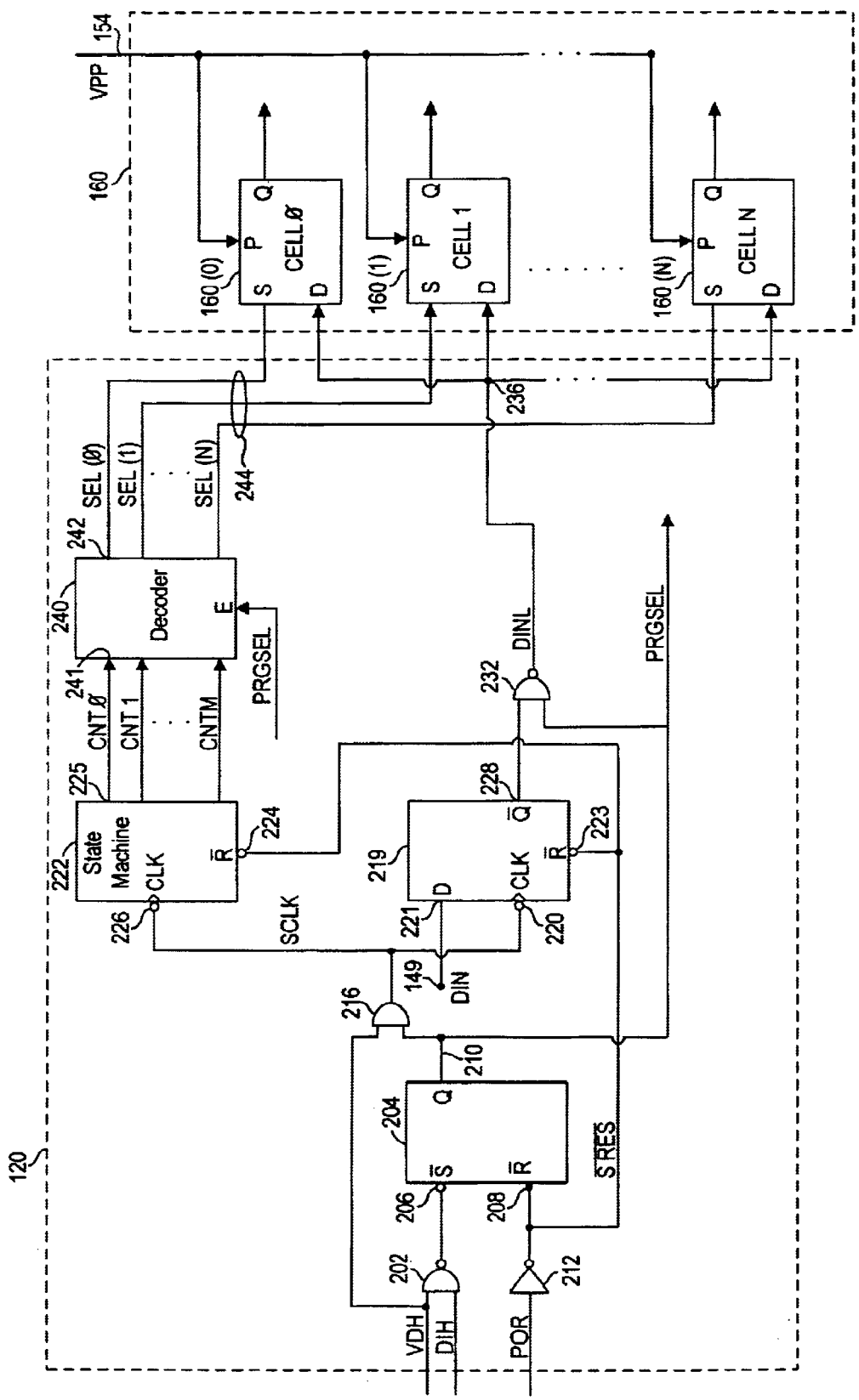
FIG. 2 is a circuit diagram illustrating details of the circuit programming control block and non-volatile memory cells of FIG. 1 in accordance with an embodiment of the present invention.

FIG. 2 illustrates portions of an exemplary programming control circuit 120 and the non-volatile memory cells 160. At the left side of FIG. 2, a NAND gate 202 has an input connected to node 116 (FIG. 1) that receives the power pin high voltage signal VDH, and another input connected to node 136 (FIG. 1) that receives the data pin high voltage signal DIH.

A set-reset latch 204 includes a set input 206, a reset input 208 and an output 210. The set input 206 is connected to and receives the output of the NAND gate 202. An inverter 212 includes an input that is connected to the node 114 (FIG. 1) and receives the power on reset signal POR. The output of the inverter 212 is connected to the reset input 208 of the latch 204. Latch 204 is reset by receiving the inverted POR signal via the inverter 212, which occurs shortly after the initial powering of circuit 100. The latch 204 is set based on the power pin high voltage signal VDH and the data pin high voltage signal DIH. When both the VDH and DIH signals are logic "high", a "1" is latched by the latch 204 and output by the latch 204 at the output 210 as program select signal PRGSEL. A program select signal PRGSEL indicates whether the programming control circuitry 120 is operating in programming mode. When the program select signal PRGSEL is at logic level one, programming mode has been initiated.

An AND gate 216 includes an input connected to node 116 and receives the power pin high voltage signal VDH. As mentioned above, high voltage $V_{DDH}$ pulses are provided via voltage signal V1 to power pin 102, and the power pin high voltage signal VDH will follow these pulses. Another input of the AND gate 216 is connected to the output 210 of the latch 204 and receives the program select signal PRGSEL. Since the power pin high voltage signal VDH pulses with the high voltage pulses of voltage signal V1 that are applied to power pin 102, the pulses will pass through AND gate 216 when programming mode is initiated. The pulsed output of the AND gate 216, which is shown as clock signal SCLK; goes to clocking inputs of state machine 222 and data latch 219.

The state machine 222 includes a reset input 224, a clock input 226, and an output 225. Reset input 224 is coupled to the output of inverter 212. Inverter 212 receives the power on reset signal POR, and outputs it in an inverted form as state machine reset signal SRES bar. Hence, state machine 222 resets when circuit 100 is initially powered, because that is when the power on reset signal POR is generated. In our example, state machine 222 is a counter, but may alternatively comprise any state machine that can accomplish the functions described herein.

Input 226 of state machine 222 is connected to the output of AND gate 216. As mentioned above, the output of AND gate 216, which is denoted as clock signal SCLK, follows the power pin high voltage signal VDH once programming mode is initiated. The power pin high voltage signal VDH pulses as a function of the serial high voltage pulses provided through power pin 102. Hence, clock signal SCLK consists of a series of pulses. State machine 222 changes state (increments) in response to clock signal SCLK.

The latch 219 includes a clock input 220, a data input 221, a reset input 223, and an inverting output 228. Clock input 220 is connected to and receives the serially-pulsed output of AND gate 216. Data input 221 is connected to node 149 (FIG. 1), and thus receives the data in signal DIN, which reflects the binary data received through data pin 104. Reset input 223 receives the state machine reset signal SRES bar, and hence resets when at the initial stage of the programming operation when the power on reset signal POR is generated. Latch 219 latches (i.e., stores) the data in signal DIN on the negative edge of pulses output by the AND gate 216 in response to the serially-pulsed power pin high voltage signal VDH. The latch 219 outputs the latched data at its inverted output 228. This will be elaborated in the discussion of FIG. 3.

A NAND gate 232 has an input connected to the output 228 of latch 219. NAND gate 232 receives the data latched and output by latch 219. Another input of the NAND gate 232 is connected to the output 210 of the latch 204, and thus receives the program select signal PRGSEL. Based on the data output by the latch 219 and the program select signal PRGSEL, the NAND gate 232 outputs a data line signal DINL at node 236. The data line signal DINL output by NAND gate 232 finally carries the binary data that was received through data pin 104 and stored in latch 219 to the data input D of all of the memory cells 160. In other words, all of the memory cells 160 simultaneously receive the same binary data via data line signal DINL.

A decoder 240 has one or more inputs 241 connected to the output 225 of state machine 222, and thus receives the binary counter signal CNT from the state machine 222. The counter signal CNT may identify one of $2^{(M+1)}$ number of different states of the counter. The decoder 240 receives and decodes the counter signal CNT output by state machine 222 during the respective counter cycle, and in turn outputs a cell select signal SEL at each of a plurality of outputs 242. Each output 242 of decoder 240 is coupled via a respective one of a plurality of cell select lines 244 to a respective one of the memory cells 160. The state of the cell select signal SEL on the respective cell select line 244, either a logical one or a logical zero, selects or deselects, respectively, the particular memory cell 160 coupled to the particular cell select line 244. A selected memory cell is programmed during the particular counter cycle, and a deselected memory cell is not programmed. Based on the state of the binary counter 222, the decoder 240 will provide an appropriate cell select signal SEL for each of the respective memory cells 160 during any particular counter cycle. For one particular state, as discussed later, the decoder 240 will provide a logical one cell select signal SEL for all the memory cells 160 during one particular counter cycle. In addition, for the particular state after the power-on reset, the decoder 240 will provide no cell select signal SEL to the memory cells 160. There may be additional states, up to the maximum number of states of the binary counter 222 that will result in no cell select signals SEL for the memory cells 160.

For the exemplary embodiment of FIGS. 1 and 2, which has memory cells 160(0) to 160(N) (total N+1), operated in accordance with the example of FIG. 3, as discussed below, a minimum number of states of binary counter 222 is (N+1)+2. N+1 states are needed to select each SEL line individually. The additional two states are an initial state (FIG. 3) where no cells are selected (all cell select signals SEL being logical zero), and another state when all cells are selected (all cell select signals SEL being logical one).

Decoder 240 also receives the program select signal PRGSEL at enable input E of decoder 240. The program select signal PRGSEL enables decoder 240 during programming mode. Accordingly, in user mode, decoder 240 is not enabled, and does not provide the cell select signals SEL to memory cells 160.

As mentioned, in one programming sequence, the memory cells 160 may be selected and programmed in sequence, one by one, first to last, until each of the memory cells 160 is programmed appropriately. In such a case, the counter signal CNT output by state machine 222 will cause decoder 240 to select a sequential one of the memory cells 160, and deselect the other memory cells 160, until all of the memory cells 160 have been selected in sequence, one at a time. In another programming sequence, the counter signal CNT output by state machine 222 will cause decoder 240 to simultaneously select all of the memory cells 160, so that all of the memory cells 160 may be programmed simultaneously.

The non-volatile memory of integrated circuit 1 includes a plurality of non-volatile memory cells 160, e.g., EEPROMs, denoted as cells 160(0)–160(N). The number of memory cells 160 can vary. Each individual cell (e.g., 160(0)), includes: (1) a select input terminal S that is coupled to an output 242 of decoder 240 via one of the cell select lines 244, and receives the cell select signal SEL provided on the cell select line 244; (2) a data input terminal D for receiving the data line signal DINL (i.e., binary data received through data pin 104) via node 236; (3) an output terminal Q for outputting the content of the memory cell 160 to circuit function block 140 (FIG. 1); and (4) a programming voltage terminal P for receiving the high voltage programming signal $V_{PP}$ pulse via line 154, switch 150, and line 151 from data pin 104. As discussed below, in order for an individual one of the memory cells 160(0)–160(N) to be programmed with data corresponding with the data line signal DINL, the individual cell must be currently selected by a select signal SEL on a corresponding select signal line 144, and the programming voltage signal $V_{PP}$ pulse received at the memory cell 160 must be above a threshold voltage capable of programming the memory cell 160.

Note that the data signal DINL and programming voltage signal $V_{PP}$ are provided to all of the memory cells 160 concurrently. Hence, whether or not one or all of the memory cells 160 are programmed in any given counter cycle upon receipt of a high programming voltage signal $V_{PP}$ pulse depends on whether the particular memory cell 160 is selected or deselected at that time, which in turn depends on the state of state machine 222.

In one embodiment, as an initial programming operation after the programming mode is entered, state machine 222 causes decoder 240 to simultaneously select all of the memory cells 160(0)–160(N) by providing each memory cell 160 with a logical one cell select signal SEL. Accordingly, all of the memory cells 160(0)–160(N) may be simultaneously and identically programmed with the binary data (either a logical one or zero) that is simultaneously provided to all of the memory cells 160 by the data line signal DINL upon receipt of the programming voltage through data pin 104.

Operation of the exemplary circuits of FIGS. 1 and 2 will be further described in conjunction with the timing diagram shown in FIG. 3. For the sake of example, FIG. 3 shows various signals in the course of programming five non-volatile memory cells 160, denoted cells 160(0) to 160(4), but the example applies to any plurality of non-volatile memory cells 160.

As mentioned with respect to FIG. 1, only three pins are required for programming memory cells 160: (1) a power pin 102; (2) a data pin 104; and (3) ground pin 106. The voltage signal V1 received on power pin 102 from power supply PS1 is shown on the top line of FIG. 3. Voltage signal V1 includes the fixed-level nominal voltage $V_{NOM}$ that is provided at all times during the programming operation, and serial pulses of the high voltage $V_{DDH}$. That is, the voltage at power pin 102 is periodically increased from the nominal voltage $V_{NOM}$ (e.g., 5 V) to the high voltage $V_{DDH}$ (e.g., 8 V) and then decreased back to the nominal voltage $V_{NOM}$. The serial high voltage $V_{DDH}$ pulses received on the power pin 104 are used within circuit 100 for clocking state machine 222. The leading edge of each high voltage $V_{DDH}$ pulse of voltage signal V1 initiates a new counter cycle.

The voltage signal V2 received on data pin 104 is shown on the second line from the top of FIG. 3. Voltage signal V2 includes low voltage binary data, which is either a logical one or a logical zero, and pulses of the high voltage $V_{HH}$. The high voltage $V_{HH}$ pulses are used to program previously-received binary data into the memory cells 160.

The status of ground pin 106 is not shown in FIG. 3, but is 0 V.

Other signals shown in FIG. 3 are internally generated within the circuits of FIGS. 1 and 2 during programming mode. For convenience, the state of the respective signals is shown as either a logical zero or a logical one. Practitioners will appreciate that the actual logical one voltages in the circuit nodes typically will have the same voltage variations as voltage signal V1 from power supply PS1. The data in signal DIN is shown twice in FIG. 3.

At time zero, the voltage signal V1 is applied at power pin 102 from power supply PS1. The voltage signal V1 ramps from 0 V to the nominal voltage $V_{NOM}$ (e.g., 5 V). In response, the power on reset signal POR goes from logic level zero to logic level one, and stays at logic level one until the voltage at power pin 102 reaches a predetermined level and a specified time passes, at which point the power on reset signal POR returns to logic level zero until the next power-on cycle. When the power on reset signal POR goes to logic level zero, the state machine reset signal SRES bar goes to logic level one. The output disable signal OUTDIS bar also goes to logic level one upon power on.

The programming mode is initiated upon: (1) receipt of a first high voltage $V_{DDH}$ pulse of voltage signal V1 at power pin 102 from power supply PS1; and (2) during that first high voltage $V_{DDH}$ pulse, receipt of a high voltage $V_{HH}$ pulse of voltage signal V2 at data pin 104 from power supply PS2. The programming mode is initiated within circuit 100 when the power pin high voltage signal VDH and the data pin high voltage signal DIH are coincidentally high. Initiation of the programming mode connotes a disabling of the user mode.

Referring to FIG. 3, at time A, the voltage signal V1 received at power pin 102 initially pulses from the nominal voltage $V_{NOM}$ to the high voltage $V_{DDH}$. This causes the power high voltage signal VDH to go to a logic level one, and the output disable signal OUTDIS bar to go to logic level zero.

Subsequently, the voltage signal V2 received at data pin 104 pulses to the high voltage $V_{HH}$. This causes high voltage detector 112 to output the data pin high voltage signal DIH at logic level one. When both the power high voltage signal VDH and the data pin high voltage signal DIH are in an initial logic level one state, programming control circuitry 120 causes the program select signal PRGSEL to go to logic level one, which indicates that the programming mode is initiated. The clock signal SCLK goes to logic level one when the power high voltage signal VDH and the program select signal PRGSEL are at logic level one. The initial high voltage $V_{HH}$ pulse of voltage signal V2 is applied to the data pin 104 for a selected period of time during the first counter cycle, and then is removed. The high voltage $V_{DDH}$ pulses of voltage signal V1 received on power pin 102 are of a greater duration than the high voltage $V_{HH}$ pulses of voltage signal V2 received on data pin 104.

The programming voltage signal $V_{PP}$ in FIG. 3 mimics the high voltage $V_{HH}$ pulses of voltage signal V2 on data pin 104 because switch 150 (FIG. 1) couples data pin 104 to line 154, which carries the high voltage pulse to the programming voltage input P of the memory cells 160. None of the memory cells 160 are selected (i.e., cell select signals SEL(0)-SEL(4) are logical zero) at the time of the initial high voltage $V_{HH}$ pulse on data pin 104.

Note that, because the initial high voltage pulse $V_{HH}$ of voltage signal V2 is not used to program memory cells 160, it need not be the same level as (e.g., may be the same or less than) the high voltage $V_{HH}$ pulses of voltage signal V2 subsequently provided on the data pin 104 to program the memory cells 160, provided the first pulse is high enough to trigger high voltage detector 136.

At time B, after programming mode is initiated, but still during the initial high voltage $V_{DDH}$ pulse of voltage signal V1 on power pin 102, a process of initially programming all of the five cells 160(0)–160(4) with a common binary data value is begun. In this example, a logical one will be simultaneously programmed in all of the memory cells 160(0)–160(4). To accomplish this, binary data corresponding to logic level one is provided via voltage signal V2 on data pin 104. The data in signal DIN goes to logic level one.

Next, the voltage of voltage signal V1 is dropped from the high voltage $V_{DDH}$ to the nominal voltage $V_{NOM}$. On the negative edge of the voltage signal V1 pulse, the power pin high voltage signal VDH goes to logic level zero. Clock signal SCLK follows to logic level zero. In addition, the data in signal DIN is stored in latch 219. Latch 219 provides the stored binary data to NAND gate 232.

Subsequently, the data line signal DINL provided to all of the memory cells 160 goes to logic level one, and decoder 240 selects all of the memory cells 160(0)–160(4) for programming by outputting all of the cell select signals SEL(0)–SEL(4) at logic level one. Hence, each memory cell 160(0)–160(4) receives an enabling cell select signal SEL, and the latched binary data via data line signal DINL.

Subsequently, at time B1, the voltage signal V2 received at data pin 104 pulses to the high voltage $V_{HH}$. The programming voltage signal $V_{PP}$ rises to the same high voltage level (i.e., equal to $V_{HH}$). When memory cells 160 receive the high programming voltage signal $V_{PP}$ via line 154, the logical one provided to the data input terminal D of memory cells 160(0)–160(4) via data line signal DINL is programmed into all of the memory cells 160(0)–160(4) in a single counter cycle, since all of the memory cells 160 are selected.

Our example will now show the sequential programming of memory cells 160(0)–160(4). Our example will store a logical zero in memory cell 160(0). At time C, the voltage signal V1 that is provided to power pin 102 pulses for a second time from the nominal voltage $V_{NOM}$ to the high voltage $V_{DDH}$. Binary data corresponding to a logical zero is provided to data pin 104 via voltage signal V2. As a result, the data in signal DIN goes to logic level zero. Next, the voltage signal V1 on the power pin 102 is dropped from the high voltage $V_{DDH}$ to the nominal voltage $V_{NOM}$. On the negative edge of the voltage signal V1 pulse, the power pin high voltage signal VDH and then the clock signal SCLK go to logic level zero. In addition, the logical zero data in signal DIN is stored in latch 219. Decoder 240 then selects only memory cell 160(0) by maintaining cell select signal SEL(0) at logic level one, and by changing cell select signals SEL(1)–SEL(4) to logic level zero. A logical zero data line signal DINL, which is output by NAND gate 323 based on the binary data stored in latch 219, also is provided to the memory cells 160. Subsequently, at time C1, the voltage signal V2 received on data pin 104 pulses to the high voltage $V_{HH}$, which raises the programming voltage signal $V_{PP}$ to the high voltage level. Since memory cell 160(0) is selected, the logical zero binary data provided to memory cell 160(0) via data line signal DINL is stored in memory cell 160(0). Since memory cells 160(1)–160(4) are not selected, they are not programmed, and continue to store a logical one.

At time D, when the voltage signal V1 provided on power pin 102 pulses for a third time to the high voltage $V_{DDH}$, a process for programming a logic level zero in cell 160(1) is begun. Binary data corresponding to a logical zero is provided to data pin 104 via voltage signal V2. The data in signal DIN goes to logic level zero. Next, the voltage signal V1 on the power pin 102 is dropped from the high voltage $V_{DDH}$ to the nominal voltage $V_{NOM}$. On the negative edge of the voltage signal V1 pulse, the power pin high voltage signal VDH and then the clock signal SCLK go to logic level zero. In addition, the logical zero data in signal DIN is latched in latch 219. Decoder 240 selects only memory cell 160(1) by changing cell select signal SEL(1) to logic level one, changing cell select signal SEL(0) to logic level zero, and maintaining cell select signals SEL(2)–SEL(4) at logic level zero. A logical zero data line signal DINL, which is output by NAND gate 323 based on the binary data stored in latch 219, also is provided to the memory cells 160. Subsequently, at time D1, the voltage signal V2 received on data pin 104 pulses to the high voltage $V_{HH}$, which raises the programming voltage signal $V_{PP}$ to the high voltage level. Since cell 160(1) is selected, the logical zero provided to memory cell 160(1) via data line signal DINL is programmed into memory cell 160(1). Since memory cells 160(0) and 160(2)–160(4) are not selected, they are not programmed, even though they also (simultaneously) received the data line signal DINL and the programming voltage signal $V_{PP}$.

Our example of FIG. 3 continues to the next memory cell, i.e., memory cell 160(2). It is desired that memory cell 160(2) store a logical one. However, during the initial programming cycle described above, a logical one already was programmed in memory cell 160(2) (and in all of the other memory cells 160). One way to maintain the logical one originally programmed in memory cell 160(2) is to not pulse the voltage signal V2 to the high voltage $V_{HH}$ when memory cell 160(2) is selected. In particular, at time E, the voltage signal V1 provided on power pin 102 pulses for a fourth time to the high voltage $V_{DDH}$. Binary data corresponding to a logic level zero (or logic level one, it does not matter here) is provided on data pin 104 via voltage signal V2. The data in signal DIN goes to logic level zero. Next, the voltage signal V1 on the power pin 102 is dropped from the high voltage $V_{DDH}$ to the nominal voltage $V_{NOM}$. On the negative edge of the voltage signal V1 pulse, the power pin high voltage signal VDH and then the clock signal SCLK go to logic level zero. In addition, the data in signal DIN is latched in latch 219. Decoder 240 then selects only memory cell 160(2) by changing cell select signal SEL(1) to logic level zero, changing cell select signal SEL(2) to logic level one, and by maintaining cell select signals SEL(0), SEL(3) and SEL(4) at logic level zero. The logical zero data line signal DINL is provided to the memory cells 160 from NAND gate 232. However, because voltage signal V2 is not pulsed to the high voltage $V_{HH}$ at time E1, a high voltage programming voltage signal $V_{PP}$ is not provided to memory cell 160(2) when it is selected. According, memory cell 160(2) is not programmed with the logical zero provided via data line signal DINL, and the logical one originally programmed into memory cell 160(2) remains therein.

At time F, when the voltage signal V1 provided on power pin 102 pulses for a fifth time to the high voltage $V_{DDH}$, a process for storing a logic level zero in memory cell 160(3) is begun. The process is the same as that described for memory cell 160(1) above, except for the selection of memory cell 160(3) and the deselection of cell 160(1) and the other memory cells 160 by decoder 240. Accordingly, further discussion is not necessary.

At time G, when the voltage signal V1 provided on power pin 102 pulses for a sixth time to the high voltage $V_{DDH}$, a process to program memory cell 160(4) with a logical one is begun, notwithstanding that a logical one already was stored in memory cell 160(4) during the initial programming. In particular, binary data corresponding to a logic level one is provided to data pin 104 via voltage signal V2. The data in signal DIN goes to logic level one. Next, the voltage signal V1 on the power pin 102 is dropped from the high voltage $V_{DDH}$ to the nominal voltage $V_{NOM}$. On the negative edge of the voltage signal V1 pulse, the power pin high voltage signal VDH and then the clock signal SCLK go to logic level zero. In addition, the logical one data in signal DIN is stored in latch 219. Decoder 240 then selects only memory cell 160(4) by changing cell select signal SEL(4) to logic level one, changing cell select signal SEL(3) to logic level zero, and by maintaining cell select signals SEL(1) and SEL(2) at logic level zero. The logical one stored in latch 219 is passed to NAND gate 232, which outputs a logical one data line signal DINL to all of the memory cells 160. Subsequently, at time G1, the voltage signal V2 received on data pin 104 pulses to the high voltage $V_{HH}$, which raises the programming voltage signal $V_{PP}$ to the high voltage level. Since only memory cell 160(4) is selected, the logical one provided to the memory cell 160(4) from NAND gate 232 via data line signal DINL is programmed in memory cell 160(4). Since memory cells 160(0)–160(3) are not selected, they are not programmed and retain their previous data.

Practitioners will appreciate that the discussion and drawings herein describe exemplary embodiments of the invention, and that various additions, deletions, substitutions, and alterations can be made without departing from the spirit and scope of the invention as defined by the appended claims.

What is claimed is:

1. A method for programming a plurality of non-volatile memory cells in an integrated circuit, the method comprising:

providing a circuit comprising a power pin, a data pin, a ground pin, wherein the plurality of non-volatile memory cells receive binary data provided through the data pin;

applying and maintaining a nominal voltage at the power pin to power the circuit a applying a ground voltage to the ground pin; and initiating a programming mode to enable the programming by applying a high voltage pulse at the power pin, and applying a high voltage pulse at the data pin while applying the high voltage pulse at the power pin, the high voltage pulses being greater than the nominal voltage.

2. The method of claim 1, further comprising:

after the programming mode is initiated, providing binary data through the data pin to at least one of the non-volatile memory cells;

subsequently providing a high voltage pulse through the data pin to the at least one non-volatile memory cell to program the binary data into the at least one memory cell.

3. The method of claim 2, wherein the binary data is provided to a plurality of the non-volatile memory cells, and then the high voltage pulse is provided to the plurality of the non-volatile memory cells, whereby the same binary data is programmed into the plurality of non-volatile memory cells.

4. The method of claim 1, further comprising:

after the programming mode is initiated, selecting only one of the non-volatile memory cells;

providing binary data through the data pin to the selected non-volatile memory cell;

subsequently providing a high voltage pulse through the data pin at least to the selected non-volatile memory cell to program the binary data into the at least one memory cell.

5. The method of claim 4, wherein the only one non-volatile memory cell is selected by applying a high voltage pulse on the power pin.

6. The method of claim 1, further comprising:

after the programming mode is initiated, sequentially selecting each of the plurality of memory cells for programming until all have been selected one at a time, by applying a series of high voltage pulses on the power pin.

7. The method of claim 6, further comprising:

providing binary data to each of the memory cells at least when the respective memory cell is selected;

subsequently providing a high voltage pulse through the data pin at least to the sequentially selected non-volatile memory cell to program the binary data into the memory cell.

8. The method of claim 6, wherein while each of the non-volatile memory cells is alone selected, the same binary data is provided to all of the non-volatile memory cells, and then the high voltage pulse is provided to all of the non-volatile memory cells, but only the one selected non-volatile memory cell is programmed with the binary data.

9. The method of claim 1, further comprising:

programming a first said non-volatile memory cell with a first binary data;

subsequently selecting the first non-volatile memory cell;

subsequently selecting a next second memory cell and deselecting the first memory cell without having programmed the first memory cell while it was selected.

10. The method of claim 1, wherein the circuit further comprises a latch coupled between the data pin and the non-volatile memory cells, the latch latches the binary data received through the data pin, and the latch provides the binary data to the non-volatile memory cells.

11. The method of claim 10, further comprising:

after the programming mode is initiated, sequentially selecting each of the plurality of memory cells for programming until all have been selected by applying a series of high voltage pulses on the power pin;

providing the binary data from the latch to each said non-volatile memory cell when the non-volatile memory cell is selected;

programming at least some of the selected non-volatile memory cells with the binary data provided from the latch.

12. The method of claim 11, wherein the step of programming at least some of the non-volatile memory cells comprises providing a high voltage pulse through the data pin to the at least some non-volatile memory cells while selected.

13. The method of claim 10, further comprising:

after the programming mode is initiated, simultaneously selecting a plurality of the non-volatile memory cells;

providing the binary data from the latch to the plurality of the non-volatile memory cells; and simultaneously programming the selected plurality of the non-volatile memory cells with the binary data provided from the latch.

14. The method of claim 13, wherein the step of programming comprises providing a high voltage pulse through the data pin to the selected plurality of the non-volatile memory cells.

15. A method of programming a non-volatile memory in an integrated circuit, wherein the integrated circuit includes a circuit for programming cells of the non-volatile memory, and the circuit includes a power pin, a data pin, and a ground pin, the method comprising:

receiving a nominal voltage at the power pin to power the circuit;

receiving a ground voltage at the ground pin; and initiating a programming mode to enable the programming upon receiving a high voltage pulse at the power pin and a high voltage pulse at the data pin while the high voltage pulse is present at the power pin, the high voltage pulses being greater than the nominal voltage.

16. The method of claim 15, further comprising:
after the programming mode is initiated, receiving binary data at the data pin;
providing the binary data to at least one of the non-volatile memory cells;
programming the binary data into the at least one non-volatile memory cell in response to a high voltage pulse received through the data pin.

17. The method of claim 15, further comprising:
after the programming mode is initiated, receiving a series of high voltage pulses on the power pin;
using the series of high voltage pulses to sequentially select each of the plurality of memory cells one at a time for programming, until all the memory cells have been selected.

18. The method of claim 17, comprising:
receiving binary data through the data pin at each of the non-volatile memory cells while the respective non-volatile memory cell is selected;
programming the binary data into each said non-volatile memory cell while the respective non-volatile memory cell is selected in response to a high voltage pulse received through the data pin at the selected non-volatile memory cell.

19. The method of claim 15, further comprising:
storing binary data obtained through the data pin;
subsequently providing the stored binary data to at least one of the memory cells; and
programming the stored binary data into the at least one non-volatile memory cell in response to a high voltage pulse received through the data pin after the binary data is stored.

20. A method of programming a non-volatile memory in an integrated circuit, wherein the integrated circuit includes a circuit for programming cells of the non-volatile memory, and the circuit includes a power pin, a data pin, and a ground pin, the method comprising:
receiving a nominal voltage on the power pin to power the circuit;
receiving a ground voltage on the ground pin;
receiving a series of high voltage pulses on the power pin while the circuit is powered;
using the series of high voltage pulses to sequentially select each of the plurality of memory cells for programming, one said memory cell at a time until all have been selected;
receiving binary data at the data pin, and providing said binary data to each said non-volatile memory cell when selected; and
programming the binary data into at least some of the selected non-volatile memory cells when selected in response to a high voltage pulse received through the data pin.

21. The method of claim 20, further comprising:
simultaneously selecting all of the non-volatile memory cells;
receiving binary data at the data pin, and providing said binary data to the non-volatile memory cells when selected; and
simultaneously programming the binary data into the selected non-volatile memory cells in response to a high voltage pulse received through the data pin.

22. The method of claim 20, wherein the circuit further comprises a latch coupled between the data pin and the non-volatile memory cells, the latch stores the binary data received through the data pin, and the latch provides the binary data to the non-volatile memory cells.

23. The method of claim 20, further comprising:
storing the binary data received through the data pin;
subsequently providing the stored binary data to the selected memory cell;
wherein the high voltage pulse is received by the data pin after the binary data is stored.

24. A programming circuit, in an integrated circuit, for programming non-volatile memory cells of the integrated circuit, said programming circuit comprising:
a power pin through which a nominal voltage is received to power the programming circuit;
a data pin through which a data input of each of the non-volatile memory cells receives binary data;
a ground pin;
a first voltage detector coupled to the power pin for detecting a high voltage applied to the power pin and generating a first signal in response thereto, and a second voltage detector coupled to the data pin for detecting a high applied at the data pin and generating a second signal in response thereto, said high voltages being greater than the nominal voltage; and
a programming control circuit coupled to the first and second voltage detectors, wherein the programming control circuit outputs a third signal when the first and second signals are received by the programming control circuitry, said third signal enabling programming of the non-volatile memory cells.

25. The programming circuit of claim 24, wherein the programming control circuit comprises a state machine, wherein an output of the state machine causes sequential ones of the non-volatile memory cells to be selected for sequential programming.

26. The programming circuit of claim 25, further comprising a decoder coupled to the output of the state machine, and to a select input of each of the non-volatile memory cells, wherein the decoder selects one of the non-volatile memory cells and deselects the remaining non-volatile memory cells based on the outputs of the state machine.

27. The programming circuit of claim 24, wherein the programming control circuit comprises a state machine, wherein an output of the state machine causes all of the non-volatile memory cells to be simultaneously selected for simultaneous programming.

28. The programming circuit of claim 24, further comprising:
a low voltage switch coupled to the data pin that passes only low level voltages to a data input of the non-volatile memory cells, and a high voltage switch coupled to the data pin that passes only high voltages to a programming voltage input of the non-volatile memory cells.

29. The programming circuit of claim 24, further comprising a latch coupled between the data pin and a data input of each of the non-volatile memory cells, wherein the latch temporarily stores binary data received at the data pin while a high voltage pulse is received at the data pin for programming the non-volatile memory cell.

30. A programming circuit, in an integrated circuit, for programming non-volatile memory cells of the integrated circuit, said programming circuit comprising:
a power pin through which a nominal voltage is received to power the programming circuit, and through which a series of high voltage pulses are received;

a data input of each of the non-volatile memory cells receives binary data, and through a programming voltage input of each of the non-volatile memory cells receives a high voltage pulse;

a ground pin; and a state machine that receives a clocking signal derived from the series of high voltage pulses received at the power pin, and with each said clocking signal outputs a signal that causes a sequential one or a plurality of the non-volatile memory cells to be selected for programming.

31. The programming circuit of claim 30, further comprising a latch coupled between the data pin and the data input of each of the non-volatile memory cells, wherein the latch stores binary data received at the data pin, and provides the stored binary data to the data input of each selected non-volatile memory cell when the high voltage pulse subsequently is received through the data pin at the programming voltage input of the non-volatile memory cell.

* * * * *